United States Patent [19]

Trost et al.

[11] Patent Number: 4,506,205

[45] Date of Patent: Mar. 19, 1985

[54] ELECTRO-MAGNETIC ALIGNMENT APPARATUS

[75] Inventors: David Trost, Fairfield; Daniel Galburt, Norwalk, both of Conn.

[73] Assignee: The Perkin-Elmer Corporation, Norwalk, Conn.

[21] Appl. No.: 502,998

[22] Filed: Jun. 10, 1983

[51] Int. Cl.³ .............................................. G05B 1/06
[52] U.S. Cl. ..................... 318/653; 318/38; 318/135; 318/640; 355/133; 269/58
[58] Field of Search ............. 355/72, 133; 354/354; 335/223, 222; 318/640, 653, 687, 38, 135; 269/58, 73; 310/12, 13

[56] References Cited

U.S. PATENT DOCUMENTS

| Re. 27,289 | 2/1972 | Sawyer | 318/38 X |
| Re. 27,436 | 7/1972 | Sawyer | 318/38 X |
| 4,087,729 | 5/1978 | Yamazaki et al. | 318/640 X |

Primary Examiner—L. T. Hix
Assistant Examiner—Della J. Rutledge
Attorney, Agent, or Firm—Thomas P. Murphy; Edwin T. Grimes; Francis L. Masselle

[57] ABSTRACT

This invention is directed to electromagnetic alignment apparatus, which is particularly adapted, among many other possible uses, for use in aligning the wafers in a microlithography system, said apparatus comprising in combination three or more spaced magnets, three or more coil assemblies mounted to pass through the magnetic fields of the magnets respectively, means for controlling the flow of current through the coil assemblies respectively, said coil assemblies being joined together to form a structure movable with respect to the magnets and adapted to carry an object thereon, the coil assemblies being wound with respect to each other so that by controlling the supply of current to the coils the structure can be moved selectively in three degrees of freedom.

10 Claims, 4 Drawing Figures

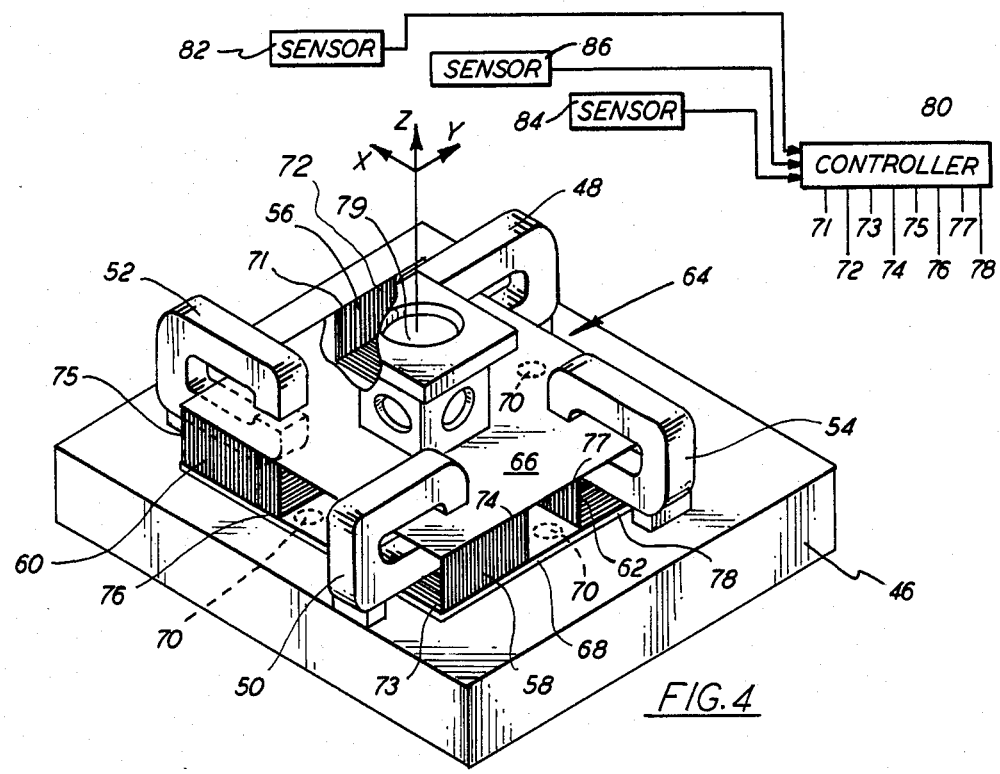
FIG. 4
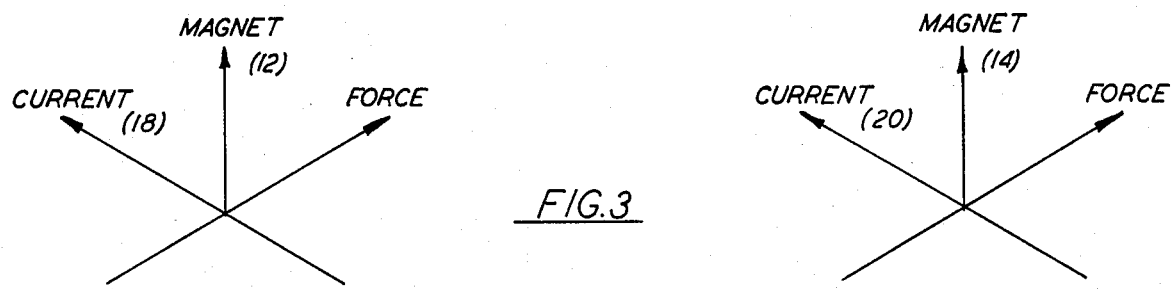
FIG. 3
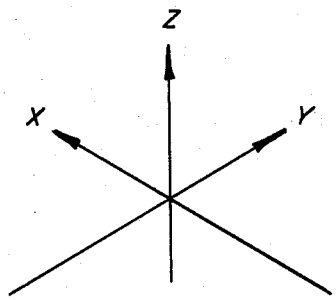
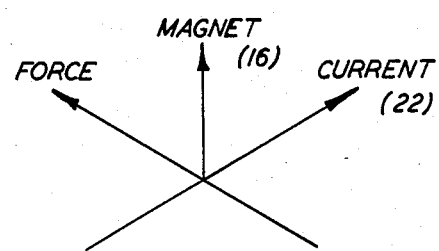

ELECTRO-MAGNETIC ALIGNMENT APPARATUS

FIELD OF INVENTION

This invention relates to alignment apparatus and, more particularly, to electro-magnetic alignment apparatus which is particularly adapted, among many other possible uses, for use in aligning the wafer in a microlithography system.

This application is closely related to my copending application entitled "Electro-Magnetic Alignment Assemblies", filed on even date herewith and bearing Ser. No. 502,995 filed 6/10/83. The disclosure therein is incorporated in the present specification by reference.

BACKGROUND OF INVENTION

Heretofore, in order to move an object in the three degrees of freedom defined by planar motion, it was necessary to employ three individual linear and/or rotary motors, each driving a single axis stage with the stages stacked on top of each other.

While such systems enjoyed reasonable success, my contribution to the art is a new type of motive means, which is an improvement over such known systems.

SUMMARY OF INVENTION

Briefly, my invention contemplates the provision of new and improved electro-magnetic alignment apparatus characterized by a minimum of three spaced magnets mounted substantially in the same plane, the same number of coil assemblies mounted to pass through the magnetic fields of the magnets respectively, means for controlling the flow of current through the coil assemblies respectively, and means for joining together the coil assemblies to form a single structure movable with respect to the magnets, which structure carries means for mounting an object thereon. Said coil assemblies are wound with respect to each other so that by controlling the supply of current to the coils said structure can be moved selectively in three degrees of freedom. In one form of the invention, two of the coils are wound in parallel with respect to each other. The third coil, and a fourth coil if employed, are wound substantially perpendicular to the first coil assembly and the second coil assembly. In one form of the invention, the magnets are mounted on a base plate, and the means for joining together the coil assemblies includes an upper plate and a lower plate with the coils disposed therebetween, and bearing means provided for mounting the lower plate on the base plate. In another form of the invention, the magnets are so mounted that they form an equilateral triangle, while in still another form four magnets are used and they form a square.

There has thus been outlined rather broadly the more important features of the invention in order that the detailed description thereof that follows may be better understood, and in order that the present contribution to the art may be better appreciated. There are, of course, additional features of the invention which will be described more fully hereinafter. Those skilled in the art will appreciate that the conception on which this disclosure is based may readily be utilized as the basis for the design of other apparatus for carrying out the several purposes of the invention. It is important, therefore, that this disclosure be regarded as including such equivalent apparatus as does not depart from the spirit and scope of the invention.

Several embodiments of the invention have been chosen for purposes of illustration and description, and are shown in the accompanying drawings, forming a part of the specification.

BRIEF DESCRIPTION OF THE DRAWINGS

FIG. 3 is a vector diagram illustrating the operational forces involved; and

FIG. 4 is a perspective view showing electro-magnetic alignment apparatus according to another embodiment of the invention.

DETAILED DESCRIPTION OF THE INVENTION

Figure 1:
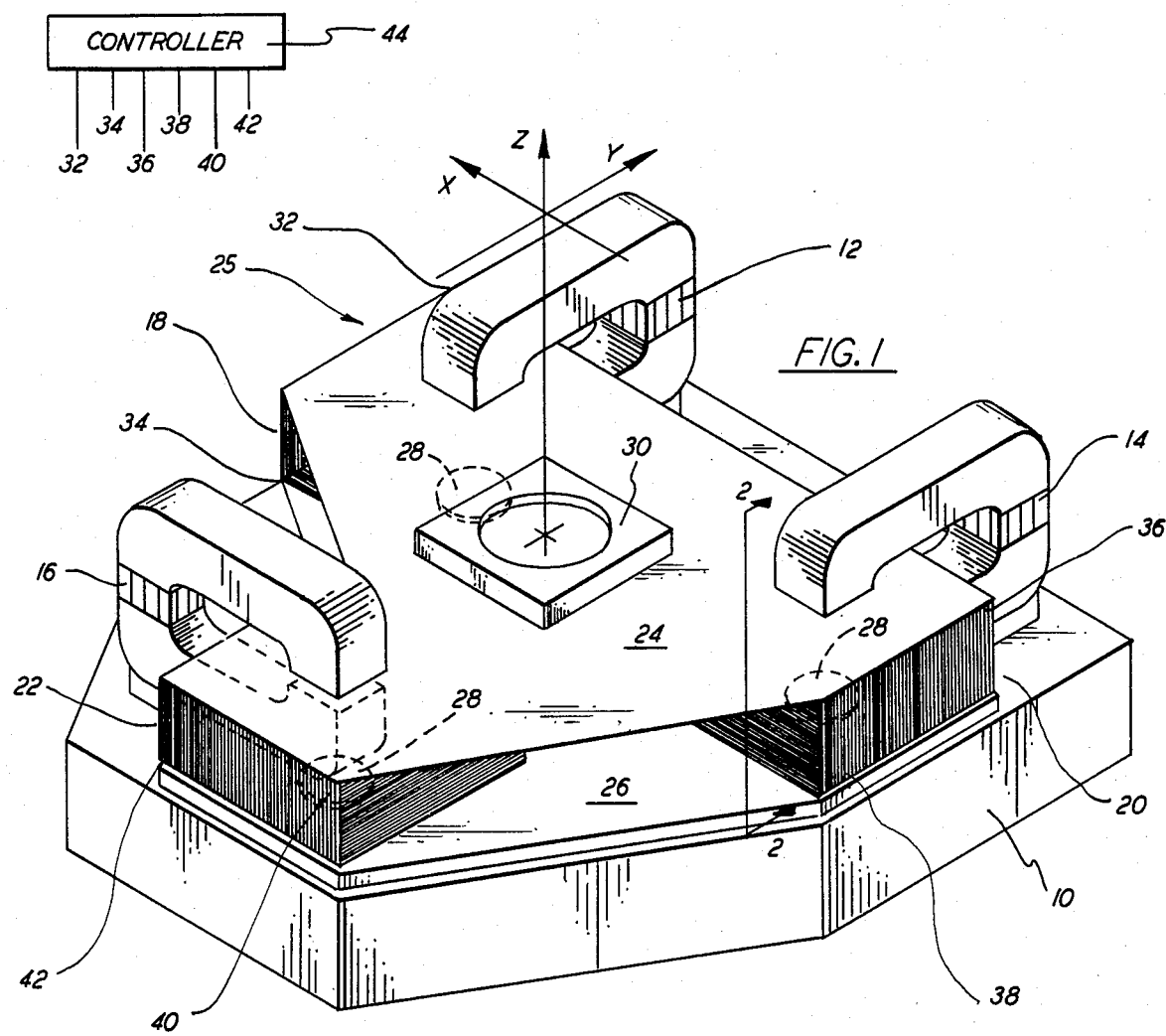
FIG. 1 is a perspective view showing electro-magnetic alignment apparatus constructed in accordance with the concepts of the present invention.

In the embodiment illustrated, on the ground structure or base plate 10 is fixedly mounted a first magnet 12, a second magnet 14 and a third magnet 16. These magnets are spaced one with respect to the other and are all mounted substantially in the same plane, and are arranged so that their magnetic fields extend in the Z direction, respectively, as indicated in FIGS. 1 and 3. Three coil assemblies 18, 20 and 22 are mounted to pass through the magnetic fields of said magnets, respectively.

Figure 2:
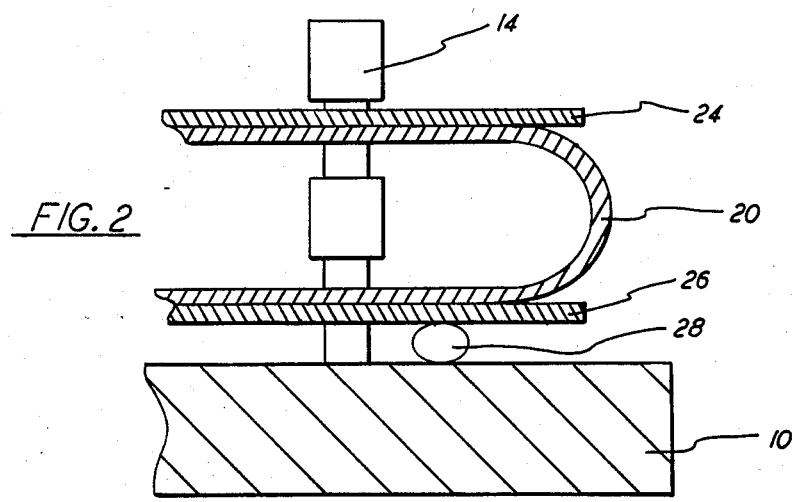
FIG. 2 is a vertical sectional view taken along the line indicated at 2—2 in FIG. 1.

Referring to FIGS. 1 and 2, means are provided for joining together the three coil assemblies to form a single structure, indicated generally at 25 in FIG. 1, movable with respect to the magnets. In the form of the invention illustrated, the joining means comprises an upper connecting plate 24 and a lower connecting plate 26. The lower plate is mounted on any suitable bearing means such as, for example, air pads or bearings 28 provided for the purpose.

The upper plate 26 carries a wafer mount 30, as seen in FIG. 1. The first coil 18 is provided with a first lead 32 and a second lead 34, while the second coil 20 has a first lead 36 and a second lead 38. Likewise, the third coil 22 has a first lead 40 and a second lead 42. The electrical current supplied to each of the leads is controlled by the controller 44.

In operation, under control of the controller 44, when the current in the first coil 18 and the current in the second coil 20 are both in the X direction, there results a net force on each of the two coils in the Y direction, as viewed in FIG. 3. When the current in the first and second coils are both in the opposite direction, then the resultant force is also in the opposite direction. When the two coils 18 and 20 are excited with currents of the opposite sign one with respect to the other, a torque is produced about the Z axis. In a like manner, when the third coil 22 is excited, a force is produced in the X direction and when the current is in the opposite direction, the force is in the opposite direction. As a result, depending on the currents applied and the directions thereof, as controlled by the controller 44, movement of the unitary structure 25 and the wafer in the holder 30 can be accurately controlled in three degrees of freedom, i.e., the X and Y directions, as well as the rotary motion about the axis Z.

In the embodiment of FIG. 4, four magnets and four coil assemblies are employed for purposes of providing greater stability to the alignment apparatus. The apparatus is mounted on a base plate 46. A first magnet 48, a second magnet 50, a third magnet 52 and a fourth magnet 54 are all fixedly mounted on the base plate 46 in spaced relationship one with respect to the others. These magnets are all mounted substantially in the same plane, and are arranged so that their magnetic fields extend in the Z direction, respectively, as indicated in FIG. 4.

A first coil assembly 56, a second coil assembly 58, a third coil assembly 60 and a fourth coil assembly 62 are mounted to pass through the magnetic fields of said magnets, respectively. Means are provided for joining together the four coil assemblies to form a single structure, indicated generally at 64 in FIG. 4, movable with respect to the magnets and the base plate 46. In the embodiment of the invention illustrated in FIG. 4, the joining means includes an upper connecting plate 66 and a lower connecting plate 68. The lower plate is mounted on any suitable bearing means such as, for example, air pads or bearings 70.

The upper plate 66 carries a wafer mount 79 when the apparatus is used for aligning the wafer in a microlithography system. Each of the four coil assemblies 48, 50, 52 and 54 is provided with two leads as indicated at 71–78 in FIG. 4. The leads are connected to a controller 80 which controls the direction and flow of current to the various coils.

In operation, under control of the controller 80, when the current in the first coil 56 and the current in the second coil 58 are both in the X direction, there results a net force on each of the two coils in the Y direction, as viewed in FIG. 4. When the current in the first and second coils are both in the opposite direction, then the resultant force is also in the opposite direction. When the current in the third coil 60 and the fourth coil 62 are both in the Y direction, there results a net force on each of the coils in the X direction, as viewed in FIG. 4. When the current in the third and fourth coils are both in the opposite direction, then the resultant force is also in the opposite direction. When the two coils 56 and 68 are excited with currents of the opposite sign one with respect to the other and/or when the two coils 60 and 62 are excited with currents of the opposite sign one with respect to the other, a torque is produced about the Z axis. The torque produced about the coils 56 and 58 with respect to the torque produced by the coils 60 and 62 could be additive or subtractive depending on the direction of current flows. As a result, depending on the currents applied and the directions thereof, as controlled by the controller 80, the movement of the unitary structure 64 and the wafer in the holder 79 can be accurately controlled in three degrees of freedom, i.e., the X and Y directions as well as the rotary motion about the axis Z.

Still referring to the embodiment of FIG. 4, any suitable sensor means may be used to sense the position of the object or wafer 79 mounted on the structure 64. Thus, a sensor 82 senses the position in the X direction, sensor 84 in the Y direction, and sensor 86 in the Z direction. These sensors provide inputs to the controller 80.

It will thus be seen that the present invention does indeed provide an improved electro-magnetic alignment apparatus, which effectively meets the objects mentioned hereinbefore.

Although certain particular embodiments of the invention are herein disclosed for purposes of explanation, further modifications thereof, after study of this specification, will be apparent to those skilled in the art to which the invention pertains. Reference should accordingly be had to the appended claims in determining the scope of the invention.

What is claimed is:

1. A commutatorless electro-magnetic alignment apparatus comprising, in combination:
   three magnets, means for mounting said magnets in spaced relationship one with respect to the others;
   three coil assemblies mounted to pass through the magnetic fields of said magnets respectively, means for controlling the flow of current through said coil assemblies respectively;
   means for connecting the coil assemblies to form a single structure which is rigid in the plane of motion and movable with respect to said magnets, means for mounting an object on said structure; and
   said coil assemblies being wound with respect to each other so that by controlling the supply of current to said coils and structure can be moved selectively in three degrees of freedom.

2. A commutatorless electro-magnetic alignment apparatus comprising, in combination:
   three magnets, means for mounting said magnets in spaced relationship one with respect to the other and substantially in the same plane;
   three coil assemblies mounted to pass through the magnetic fields of said magnets, respectively;
   means for connecting said coil assemblies to form a single structure which is rigid in the plane of motion and movable with respect to said magnets, means for mounting an object on said structure;
   two of said coil assemblies being wound substantially in parallel with respect to each other and the third coil assembly being wound substantially perpendicularly to the first and second coil assemblies; and
   means for controlling the flow and direction of current through said coil assemblies, respectively.

3. Apparatus according to claim 2 wherein said means for mounting said magnets comprises a base plate.

4. Apparatus according to claim 3 wherein said means for connecting together said three assemblies includes an upper plate and a lower plate with the coils disposed therebetween, bearing means for mounting said lower plate on said base plate.

5. Apparatus according to claim 2 wherein said magnets are so mounted that they form an equilateral triangle.

6. A commutatorless electro-magnetic alignment apparatus comprising, in combination:
   four magnets, means for mounting said magnets in spaced relationship one with respect to the others and substantially in the same plane;
   four coil assemblies mounted to pass through the magnetic fields of said magnets, respectively;
   means for connecting said four coil assemblies to form a single structure which is rigid in the plane of motion and movable with respect to said magnets, means for mounting an object on said structure;
   two of said coil assemblies being wound substantially in parallel with respect to each other and the other two of said coil assemblies being wound substantially perpendicular to the first two of said coil assemblies; and
   means for controlling the flow and direction of current through said coil assemblies respectively.

7. Apparatus according to claim 6 wherein said means for mounting said magnets comprises a base plate.

8. Apparatus according to claim 7 wherein said means for connecting together said four assemblies includes an upper plate and a lower plate with the coils disposed therebetween, bearing means for mounting said lower plate on said base plate.

9. Apparatus according to claim 6 wherein said magnets are so mounted that they form a square configuration.

10. Apparatus according to claim 6 wherein said apparatus further comprises a plurality of sensor means for sensing the position of said movable structure, said sensor means providing an input to said controller means.

* * * * *